United States Patent
Zhou et al.

(10) Patent No.: US 10,640,224 B2
(45) Date of Patent: May 5, 2020

(54) MOTOR CONTROL METHOD, APPARATUS, AND SYSTEM

(71) Applicant: SZ DJI TECHNOLOGY CO., LTD., Shenzhen (CN)

(72) Inventors: Changxing Zhou, Shenzhen (CN); Qiu Lan, Shenzhen (CN); Jinyun Ni, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/116,279

(22) Filed: Aug. 29, 2018

(65) Prior Publication Data
US 2019/0009919 A1  Jan. 10, 2019

Related U.S. Application Data

(63) Continuation of application No. PCT/CN2016/075097, filed on Mar. 1, 2016.

(51) Int. Cl.
*H02P 6/08* (2016.01)
*H02P 7/298* (2016.01)
*B64D 31/02* (2006.01)
*G01R 31/389* (2019.01)
*G01R 31/36* (2020.01)
*H02P 27/06* (2006.01)
*H02P 27/14* (2006.01)
*H02P 4/00* (2006.01)
(Continued)

(52) U.S. Cl.
CPC ......... *B64D 31/02* (2013.01); *G01R 31/3648* (2013.01); *G01R 31/389* (2019.01); *H02P 4/00* (2013.01); *H02P 6/08* (2013.01); *H02P 27/06* (2013.01); *H02P 27/14* (2013.01); *B64C 39/024* (2013.01); *B64C 2201/024* (2013.01); *B64C 2201/042* (2013.01); *B64D 31/00* (2013.01); *H02P 2201/00* (2013.01); *H02P 2205/03* (2013.01)

(58) Field of Classification Search
USPC .......................................... 318/632
See application file for complete search history.

(56) References Cited

U.S. PATENT DOCUMENTS 4,558,281 A * 12/1985 Codd ............... G01R 31/36
  324/433
5,467,281 A * 11/1995 Iwashita ........... B62D 5/065
  180/422

(Continued)

FOREIGN PATENT DOCUMENTS

CN  1412934 A   4/2003
CN  1275382 C   9/2006
(Continued)

OTHER PUBLICATIONS

The World Intellectual Property Organization (WIPO) International Search Report for PCT/CN2016/075097 dated Nov. 30, 2016 6 pages.

*Primary Examiner* — Bentsu Ro
(74) *Attorney, Agent, or Firm* — Anova Law Group, PLLC

(57) ABSTRACT

A method for controlling a motor includes obtaining a present electrical parameter of a battery, calculating a compensation amount of a control signal of the motor according to the present electrical parameter, and modifying the control signal according to the compensation amount.

17 Claims, 7 Drawing Sheets

(51) Int. Cl.
  *B64D 31/00* (2006.01)
  *B64C 39/02* (2006.01)

(56) References Cited

U.S. PATENT DOCUMENTS

| | | | |
|---|---|---|---|
| 7,541,756 B1* | 6/2009 | Parent | H02P 23/0077 |
| | | | 318/139 |
| 2008/0309289 A1* | 12/2008 | White | H02J 7/0063 |
| | | | 320/136 |
| 2009/0183714 A1* | 7/2009 | Mayuzumi | F02D 41/20 |
| | | | 123/490 |
| 2012/0197471 A1 | 8/2012 | Irisawa et al. | |
| 2012/0287687 A1* | 11/2012 | Lin | H02M 7/53871 |
| | | | 363/95 |

FOREIGN PATENT DOCUMENTS

| | | | |
|---|---|---|---|
| CN | 101159340 A | 4/2008 | |
| CN | 101806867 A | 8/2010 | |
| CN | 102208890 A | 10/2011 | |
| CN | 102522796 A | 6/2012 | |
| CN | 103527338 A | 1/2014 | |
| CN | 104333068 A | 2/2015 | |
| CN | 104709102 A | 6/2015 | |
| CN | 105093130 A | 11/2015 | |
| CN | 105324930 A | 2/2016 | |
| EP | 0739085 A2 | 10/1996 | |
| JP | 2013115867 A | 6/2013 | |

* cited by examiner

MOTOR CONTROL METHOD, APPARATUS, AND SYSTEM

CROSS-REFERENCE TO RELATED APPLICATION

This application is a continuation application of International Application No. PCT/CN2016/075097, filed on Mar. 1, 2016, the entire contents of which are incorporated herein by reference.

TECHNICAL FIELD

The present disclosure relates to the field of unmanned aerial vehicle and, more particularly, to a method, a device, and a system for controlling a motor.

BACKGROUND

In conventional technologies, a battery supplies power to an electronic speed controller (ESC), such that the ESC outputs a voltage to a motor and thus control a speed of the motor. The ESC receives a throttle signal sent from a flight controller. An increased high-level pulse width, i.e., an increased high-level pulse time duration, of the throttle signal may indicate that a higher rotation speed of the motor may be needed by the flight controller.

However, a voltage of the battery continuously decreases during the discharging process. Compared with an original full voltage of the battery, the voltage outputted from the ESC to the motor decreases as the battery voltage decreases, when the ESC receives a same throttle signal. Thus, the rotation speed of the motor decreases. When an unmanned aerial vehicle performs actions that need high mobility, issues of slow response often occur, and the unmanned aerial vehicle has decreasing power during a flight.

SUMMARY

In accordance with the disclosure, there is provided a method for controlling a motor. The method includes obtaining a present electrical parameter of a battery, calculating a compensation amount of a control signal of the motor according to the present electrical parameter, and modifying the control signal according to the compensation amount.

Also in accordance with the disclosure, there is provided another method for controlling a motor. The method includes obtaining a present electrical parameter of a battery, calculating a voltage compensation amount of the battery according to the present electrical parameter, and compensating an output voltage of the battery according to the voltage compensation amount to maintain the output voltage of the battery stable.

Also in accordance with the disclosure, there is provided an apparatus for controlling a motor. The apparatus includes one or more processors. The one or more processors are configured to obtain a present electrical parameter of a battery, calculate a compensation amount of a control signal of the motor according to the present electrical parameter, and modify the control signal according to the compensation amount.

Figure 1:
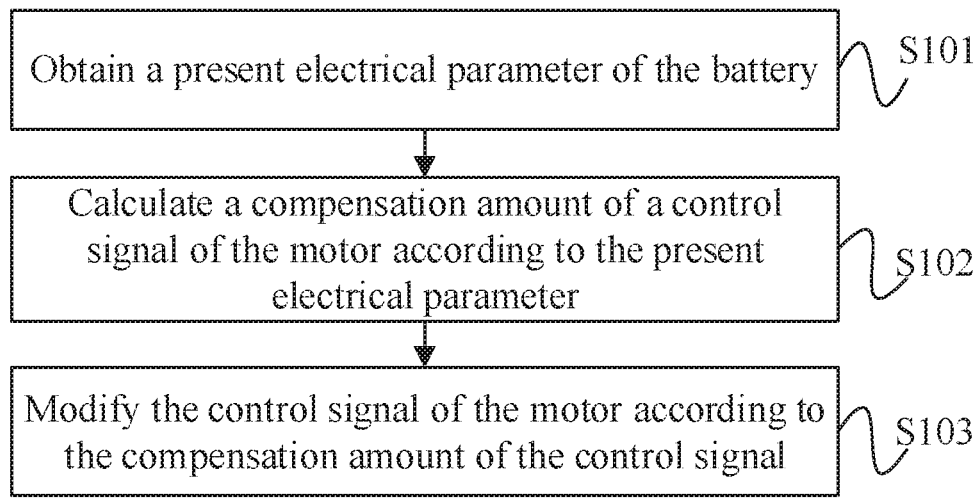
FIG. 1 is a flowchart of an exemplary motor control method consistent with various disclosed embodiments of the present disclosure.

Reference numerals used in the drawings include: 20, battery; 21, electronic speed controller (ESC); 22, motor; 23, flight controller; 24, voltage sensor; 25, switch controller; switch; 27, external power supply; 1001, power system; 1002, propeller; and 1003, electronic speed controller (ESC).

DETAILED DESCRIPTION OF THE EMBODIMENTS

Technical solutions of the present disclosure will be described with reference to the drawings. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

As used herein, when a first component is referred to as "fixed to" a second component, it is intended that the first component may be directly attached to the second component or may be indirectly attached to the second component via another component. When a first component is referred to as "connecting" to a second component, it is intended that the first component may be directly connected to the second component or may be indirectly connected to the second component via a third component between them. The terms "perpendicular," "horizontal," "left," "right," and similar expressions used herein are merely intended for description.

Unless otherwise defined, all the technical and scientific terms used herein have the same or similar meanings as generally understood by one of ordinary skill in the art. As described herein, the terms used in the specification of the present disclosure are intended to describe exemplary embodiments, instead of limiting the present disclosure. The term "and/or" used herein includes any suitable combination of one or more related items listed.

Further, in the present disclosure, the disclosed embodiments and the features of the disclosed embodiments may be combined when there are no conflicts.

Figure 2:
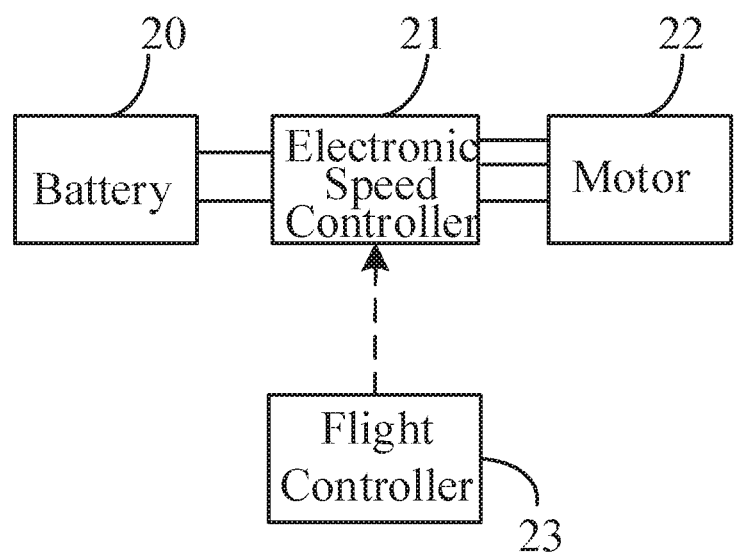
FIG. 2 is a topological diagram for an exemplary motor control method consistent with various disclosed embodiments of the present disclosure.

The present disclosure provides a method for controlling a motor. FIG. 1 is a flowchart of an exemplary motor control method consistent with various disclosed embodiments of the present disclosure. FIG. 2 is a topological diagram for an exemplary motor control method consistent with various disclosed embodiments of the present disclosure. As shown in FIG. 2, a battery 20 provides power to n electronic speed controller (ESC) 21. The ESC 21 outputs a voltage to a motor 22 to cause the motor to rotate, and controls an operating status of the motor 22, such as a rotation speed, steering, or the like. A flight controller 23 sends a throttle signal to the ESC 21 through a wireless transmission. The ESC 21 controls a magnitude of the voltage outputted to the motor 22 according to a magnitude of the throttle signal, and thus controls a magnitude of the rotation speed of the motor 22. In some embodiments, the throttle signal may include a rectangular wave. Further, an increased high-level pulse width, i.e., an increased high-level pulse time duration, of the rectangular wave may indicate that the flight controller 23 may, need the motor to rotate at a higher rotation speed. As the battery voltage continuously decreases during the discharging process, the rotation speed of the motor may decrease. Thus, when the UAV performs actions that need high mobility, issues of slow response may occur, and the power of the LAN' may decrease during a flight. The present disclosure provides a motor control method that solves this problem. The control method can be implemented, e.g., by a control apparatus of the motor. The control apparatus may be coupled to the motor, and may obtain the present electrical parameter of the battery. With reference to FIG. 1, the method is described below.

At S101, a present electrical parameter of the battery is obtained.

In some embodiments, the battery may be coupled to an electrical parameter sensor, and the electrical parameter sensor may be used for detecting an electrical parameter of the battery. In some embodiments, the control apparatus may obtain a present electrical parameter of the battery from the electrical parameter sensor. In some other embodiments, the control apparatus may include an electrical parameter detection circuit. The electrical parameter detection circuit may be used for detecting the present electrical parameter of the battery. The present electrical parameter may include at least one of a present electrical charge quantity of the battery, a present voltage of the battery, a present output electrical current of the battery, or a present internal resistance of the battery.

At S102, a compensation amount of a control signal of the motor is calculated according to the present electrical parameter.

The electrical parameter of the battery may continuously change during discharge. For example, an electrical charge quantity of the battery may continuously decrease, an output voltage of the battery may continuously decrease, and an output power of the battery may continuously decrease. For a same throttle signal, in order to prevent the control signal for the motor from fluctuating with a variation of the battery electrical parameter, i.e., the electrical parameter of the battery, in some embodiments, a compensation amount of the control signal for the motor that needs to be compensated due to the change of the electrical parameter of the battery may be calculated according to the present electrical parameter of the battery.

In some embodiments, the control signal of the motor may include at least one of a control signal configured to control a rotation speed of the motor or a control signal configured to control an output power of the motor.

At S103, the control signal of the motor is modified according to the compensation amount of the control signal.

According to the compensation amount calculated in the above processes, the control signal of the motor may be modified. Since the control signal of the motor decreases with the drop of the battery electrical parameter, in some embodiments, a modification method may include adding the compensation amount to an original control signal of the motor.

In some embodiments, the present electrical parameter of the battery may include a characteristic parameter associated with the battery itself, and the control signal for the motor may include a parameter associated with a motor characteristic, which are not restricted in the present disclosure.

In some embodiments, a compensation amount of the control signal of the motor may be calculated according to the present electrical parameter of the battery, and the control signal of the motor may be modified according to the compensation amount of the control signal, such that the control signal of the motor is prevented from fluctuating along with the change of the electrical parameter of the battery. Correspondingly, motor control signals under control of a same throttle signal may be prevented from being different. Thus, wen a UAV performs actions that need high mobility, occurrence of issues of slow response and decreasing power of the UAV during a flight may be suppressed.

Figure 3:
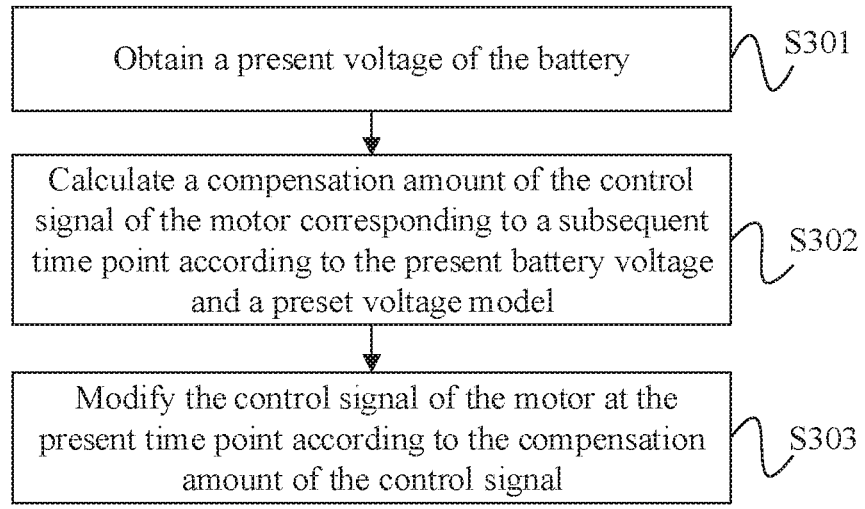
FIG. 3 is a flowchart of another exemplary motor control method consistent with various disclosed embodiments of the present disclosure.

The present disclosure provides another motor control method. In addition to the above-described examples, a compensation amount of the control signal of the motor may be calculated through a feedforward control approach, and a control signal of the motor may be modified according to the compensation amount of the control signal. FIG. 3 is a flowchart of another exemplary motor control method consistent with various disclosed embodiments of the present disclosure. With reference to FIG. 3, the method is described below.

At S301, a present voltage of the battery is obtained.

In some embodiments, the present electrical parameter of the battery may include a present battery voltage, i.e., the present voltage of the battery. The approach to obtain the present battery voltage may include coupling a voltage sensor to two terminals of the battery, i.e., the power supply, in parallel. The voltage sensor may detect the battery voltage in real time, or periodically detect the battery voltage. The voltage sensor may be coupled to the control apparatus and controlled by the control apparatus to detect the battery voltage. In some embodiments, the control apparatus may send a collection control signal to the voltage sensor, such that the voltage sensor may obtain the present battery voltage according to the collection control signal.

At S302, a compensation amount of the control signal of the motor corresponding to a subsequent time point is calculated according to the present battery voltage, also referred to as a "present voltage of the battery," and a preset voltage model. In some embodiments, in the preset voltage model, battery voltages correspond to preset compensation amounts in a one-to-one manner.

In some embodiments, a voltage model r ray be preset according to a discharge curve of the battery. The voltage model, e.g., the preset voltage model, may indicate a correspondence between the battery voltages and the compensation amounts of the control signal for the motor. In some embodiments, in the voltage model, the battery voltages may correspond to the compensation amounts of the control signal of the motor in one-to-one manner. A subsequent time point at which the battery voltage drops and an amount of the voltage drop may be predicted at a present time point according to the voltage model, and a compensation amount of the control signal of the motor corresponding to the subsequent time point may be determined according to the amount of the voltage drop, i.e., the predicted amount of the voltage drop, corresponding to the subsequent time point.

At S303, the control signal of the motor is modified at the present time point according to the compensation amount of the control signal.

According to the compensation amount of the control signal of the motor corresponding to the subsequent time point, the control signal of the motor is modified at the present time point. In some embodiments, at the present time point, the compensation amount may be added to the control signal of the motor to prevent a drop of the motor rotation speed caused by a drop of the battery voltage at the subsequent time point.

In some embodiments, through a preset voltage model, a one-to-one correspondence between battery voltages and preset compensation amounts may be determined. A compensation amount of the control signal of the motor corresponding to the subsequent time point may be calculated according to a present battery voltage and the preset voltage model. The control signal of the motor may be modified at the present time point to prevent a drop of the motor rotation speed caused by a drop of the battery voltage at the subsequent time point, thereby improving timeliness of modifying the control signal of the motor.

Figure 4:
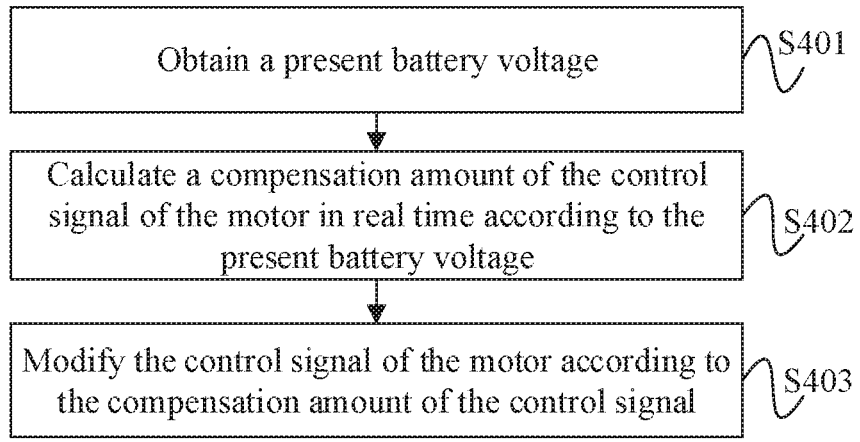
FIG. 4 is a flowchart of another exemplary motor control method consistent with various disclosed embodiments of the present disclosure.

The present disclosure provides another motor control method. In some embodiments, in addition to the above-described example, a compensation amount of the control signal of the motor may be calculated through a feedback control approach, and the control signal of the motor may be modified according to the compensation amount of the control signal. FIG. 4 is a flowchart of an exemplary motor control method consistent with various disclosed embodiments of the present disclosure. With reference to FIG. 4, the method is described below.

At S401, a present battery voltage is obtained.

Process S401 is same as or similar to process S301, descriptions of which are omitted here.

At S402, a compensation amount of the control signal of the motor is calculated in real time according to the present battery voltage.

In some embodiments, the control signal of the motor may control a rotation speed of the motor. After the control apparatus obtains the present battery voltage, if the present battery voltage is lower than a full battery voltage, and under the condition that the throttle signal is fixed, the rotation speed of the motor may have decreased. A needed compensation amount of the rotation speed of the motor may be calculated in real time at the present time point.

At S403, the control signal of the motor is modified according to the compensation amount of the control signal.

After the control apparatus calculates the compensation amount of the rotation speed of the motor that needs to be compensated, the control apparatus may actively increase the rotation speed of the motor. In some embodiments, the compensation amount may be added to the decreased rotation speed of the motor to prevent the rotation speed of the motor from being changed by the fluctuation of the battery voltage.

In some embodiments, a compensation amount of the control signal of the motor may be calculated in real time, and thus the control signal of the motor may be calculated according to the compensation amount of the control signal, thereby improving real time performance of modifying the control signal of the motor.

Figure 5:
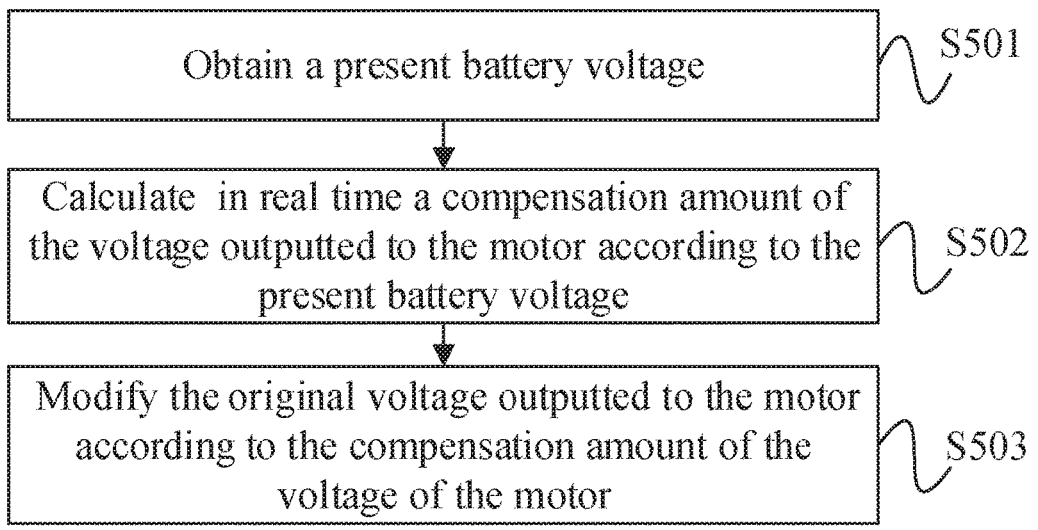
FIG. 5 is a flowchart of another exemplary motor control method consistent with various disclosed embodiments of the present disclosure.

The present disclosure provides another motor control method. In some embodiments, in addition to the above-described examples, a compensation amount of the voltage of the motor may be calculated through a feedback control approach, and an original voltage outputted by the ESC to the motor may be modified according to the compensation amount of the voltage of the motor. FIG. 5 is a flowchart of another exemplary motor control method consistent with various disclosed embodiments of the present disclosure. With reference to FIG. 5, the method is described below.

At S501, a present battery voltage is obtained.

Process S501 is same as or similar to process S301, descriptions of which are omitted here.

At S502, a compensation amount of the voltage outputted to the motor is calculated in real time according to the present battery voltage.

The compensation amount of the voltage of the motor may be determined according to a difference between the full battery voltage and the present battery voltage. A formula for calculating the compensation amount of the voltage may be $$P = (V_0 - V_t) * \frac{S_t}{V_0},$$

where P denotes the compensation amount of the voltage outputted to the motor, $V_0$ denotes the full battery voltage, t denotes the present time point, $V_t$ denotes the present battery voltage, $S_t$ denotes a voltage value corresponding to a throttle signal at the present time point.

For example, the full battery voltage may be 5V, the ESC may output a voltage to the motor at one of five levels. A first level may correspond to an output voltage of approximately 1 V. A second level may correspond to an output voltage of approximately 2 V. A third level may correspond to an output voltage of approximately 3 V. A fourth level may correspond to an output voltage of approximately 4 V. A fifth level may correspond to an output voltage of approximately 5 V. The output voltage of approximately 1 V may correspond to a motor rotation speed of approximately 100 revolutions per second (RPS). The output voltage of approximately 2 V may correspond to a motor rotation speed of approximately 200 RPS. The output voltage of approximately 3 V may correspond to a motor rotation speed of approximately 300 RIPS. The output voltage of approximately 4 V may correspond to a motor rotation speed of approximately 400 RPS. The output voltage of approximately 5 V may correspond to a motor rotation speed of approximately 500 RPS. Assuming that the throttle signal is approximately 2, the output voltage of the ESC outputted to the motor may be controlled to be approximately 2V. Thus, the motor rotation speed may be controlled to be approximately 200 RPS. As the battery discharges, the battery voltage may continuously drop. If a present battery voltage is approximately 3V and the throttle signal received by the ESC does not change, then for a full battery voltage of approximately 5V, an actual output voltage outputted by the ESC to the motor may be ⅗*2=1.2V. According to the formula $$P = (V_0 - V_t) * \frac{S_t}{V_0},$$

the voltage compensation amount be (5−3)*⅖=0.8V.

At S503, the original voltage outputted to the motor is modified according to the compensation amount of the voltage of the motor.

Approximately 0.8 V may be added to the voltage of the approximately 1.2 V outputted by the ESC to the motor, to ensure that under the control of a same throttle signal, the motor rotation speed does not change with the variation of the battery voltage.

In some embodiments, a compensation amount of the voltage outputted to the motor may be calculated in real time, and the original voltage outputted to the motor may be modified according to the compensation amount of the voltage of the motor, thereby improving an accuracy of modifying the control signal of the motor.

Figure 6:
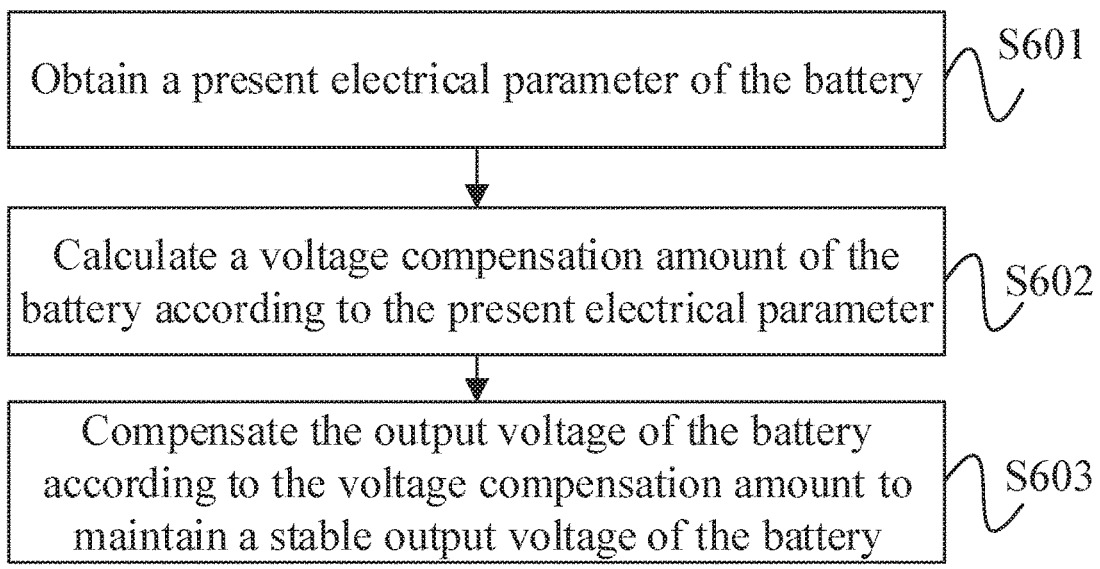
FIG. 6 is a flowchart of another exemplary motor control method consistent with various disclosed embodiments of the present disclosure.

The present disclosure provides another motor control method. In some embodiments, the battery voltage may be controlled in using hardware, such that the output voltage of the battery may be held stable, and a rotation speed of the motor may be prevented from fluctuating along with the fluctuation of the battery voltage. FIG. 6 is a flowchart of another exemplary motor control method consistent with various disclosed embodiments of the present disclosure. With reference to FIG. 6, the method is described below.

At S601, a present electrical parameter of the battery is obtained.

The present electrical parameter of the battery includes at least one of a present charge quantity of the battery, a present voltage of the battery, a present output electrical current of the battery, or a present internal resistance of the battery.

Figure 7:
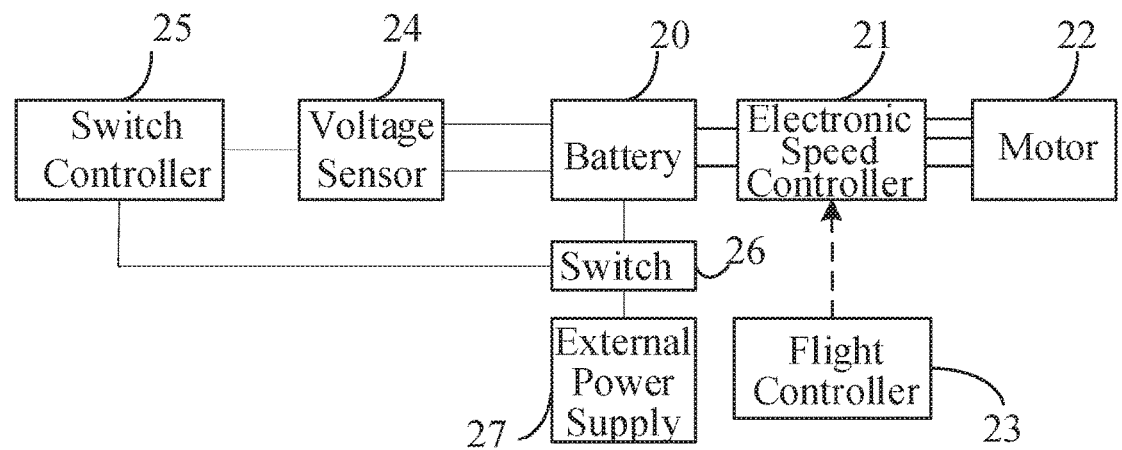
FIG. 7 is another topological diagram for an exemplary motor control method consistent with various disclosed embodiments of the present disclosure.

FIG. 7 is a topological diagram of an exemplary motor control method consistent with various disclosed embodiments of the present disclosure. As shown in FIG. 7, a voltage sensor 24 is coupled to the power supply, i.e., the battery, in parallel. Through the voltage sensor 24, the output voltage of the battery may be detected in real time or periodically.

At S602, a voltage compensation amount of the battery is calculated according to the present electrical parameter.

In some embodiments, the voltage compensation amount of the battery may be calculated according to a present battery voltage and a full battery voltage. The voltage compensation amount may be equal to a difference between the full battery voltage and the present battery voltage.

When the voltage sensor 24 detects the present battery voltage, a magnitude of the present battery voltage may be transmitted to a switch controller 25, and the switch controller 25 may calculate an amplitude drop of the battery voltage. For example, the full battery voltage may be approximately 5V, the present battery voltage may be approximately 4.5V, and thus the voltage compensation amount of the battery may be approximately 0.5V.

At S603, the output voltage of the battery is compensated according to the voltage compensation amount to maintain a stable output voltage of the battery.

As shown in FIG. 7, the battery 20 is coupled to an external power supply 27 through a switch 26. As the battery voltage drops, the switch controller 25 turns on the switch 26 to electrically couple the battery 20 to the external power supply 27. The external power supply 27 compensates the battery 20 by a voltage of approximately 0.5 V, to ensure that the output voltage of the battery is held at approximately 5V.

In some embodiments, in response to the voltage sensor 24 detecting that the present battery voltage is lower than the full battery voltage, the switch controller 25 may directly turn on the switch 26 to electrically couple the battery 20 to the external power supply 27, and the external power supply 27 may add a voltage to the battery. In response to the voltage sensor 24 detecting that the present battery voltage recovers to the full battery voltage, the switch controller 25 may directly cut, i.e., turn off, the switch 26. In response to the voltage sensor 24 detecting that the present battery voltage decreases again, the switch controller 25 may repeat the operation of turning on the switch 26 and subsequent operations.

In some embodiments, a present electrical parameter of the battery may be detected, and a voltage compensation amount of the battery may be calculated according to the present electrical parameter. An output voltage of the battery may be compensated according to the voltage compensation amount, such that the output voltage of the battery is held stable. Accordingly, the control signal of the motor may be prevented from fluctuating with the change of the electrical parameter of the battery. Correspondingly, motor control signals under control of a same throttle signal may be prevented from being different. Thus, when a UAV performs actions that need high mobility, occurrence of issues of slow response and decreasing power of the UAV during a flight may be suppressed.

Figure 8:
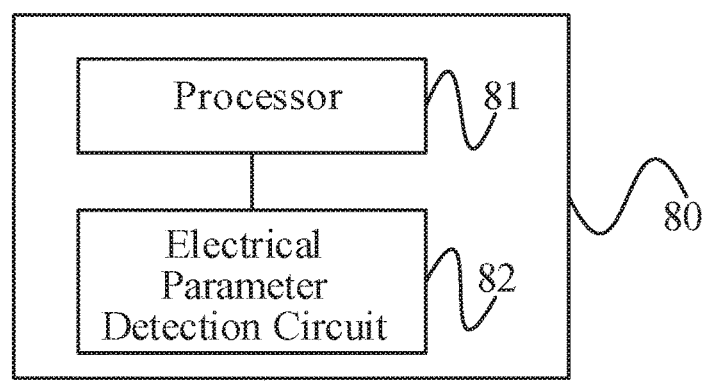
FIG. 8 is a block diagram of an exemplary motor control apparatus consistent with various disclosed embodiments of the present disclosure.

The present disclosure provides another motor control apparatus. FIG. 8 is a block diagram of an exemplary control apparatus consistent with various disclosed embodiments of the present disclosure. As shown in FIG. 8, the motor control apparatus 80 includes one or more processors 81. The one or more processors 81 are configured to obtain a present electrical parameter, calculate a compensation amount of the control signal of the motor according to the present electrical parameter, and modify a control signal of the motor according to the compensation amount of the control signal.

The control apparatus of the present disclosure may be configured to execute one of the methods consistent with the disclosure, such as the example method described above in connection with FIG. 1. Detailed descriptions of functions of the control apparatus are omitted here.

In some embodiments, a compensation amount of the control signal of the motor may be calculated according to the present electrical parameter of the battery, and the control signal of the motor may be modified according to the compensation amount of the control signal, such that the control signal of the motor is prevented from fluctuating along with the change of the electrical parameter of the battery. Correspondingly, motor control signals under control of a same throttle signal may be prevented from being different. Thus, when a UAV performs actions that need high mobility, occurrence of issues of slow response and decreasing power of the UAV during a flight may be suppressed.

Further, as shown in FIG. 8, the motor control apparatus 80, i.e., the control apparatus of the motor, also includes an electrical parameter detection circuit 82. The electrical parameter detection circuit 82 is electrically coupled to the one or more processors 81 and configured to detect the present electrical parameter of the battery.

In some embodiments, the electrical parameter detection circuit 82 may include at least one of a coulometer, a voltage detection circuit, an electrical current detection circuit, or a resistance detection circuit.

In some embodiments, the one or more processors 81 may be configured to calculate a compensation amount of the control signal of the motor corresponding to a subsequent time point according to the present battery voltage and a preset voltage model. In some embodiments, in the preset voltage model, battery voltages may correspond to preset compensation amounts in a one-to-one manner. The one or more processors 81 may be further configured to modify, at a present time point, a control signal of the motor according to the compensation amount of the control signal.

In some embodiments, the one or more processors 81 may be configured to calculate in real time a compensation amount of the control signal of the motor according to the present battery voltage.

Further, the one or more processors 81 may be configured to calculate in real time a compensation amount of the voltage outputted to the motor according to the present battery voltage, and modify an original voltage outputted to the motor according to the compensation amount of the voltage of the motor.

The control apparatus of the present disclosure may be configured to execute one of the methods consistent with the disclosure, such as one of the example methods described above in connection with FIGS. 3-5. Detailed descriptions of functions of the control apparatus are omitted here.

In some embodiments, through a preset model, a one-to-one correspondence between battery voltages and preset compensation amounts may be determined. A compensation amount of the control signal of the motor corresponding to a subsequent time point may be calculated according to a present battery voltage and the preset voltage model. Further, the control signal of the motor may be modified at the present time point to prevent a drop of the motor rotation speed caused by a drop of the battery voltage at the subsequent time point, thereby improving timeliness of modifying the control signal of the motor. Further, a compensation amount of the control signal of the motor may be calculated in real time, and the control signal of the motor may be calculated according to the compensation amount of the control signal, thereby improving real time performance of modifying the control signal of the motor. The compensation amount of the voltage outputted to the motor may be calculated in real time, and an original voltage outputted to the motor may be modified according to the compensation amount of the voltage of the motor, thereby improving an accuracy of modifying the control signal of the motor.

Figure 9:
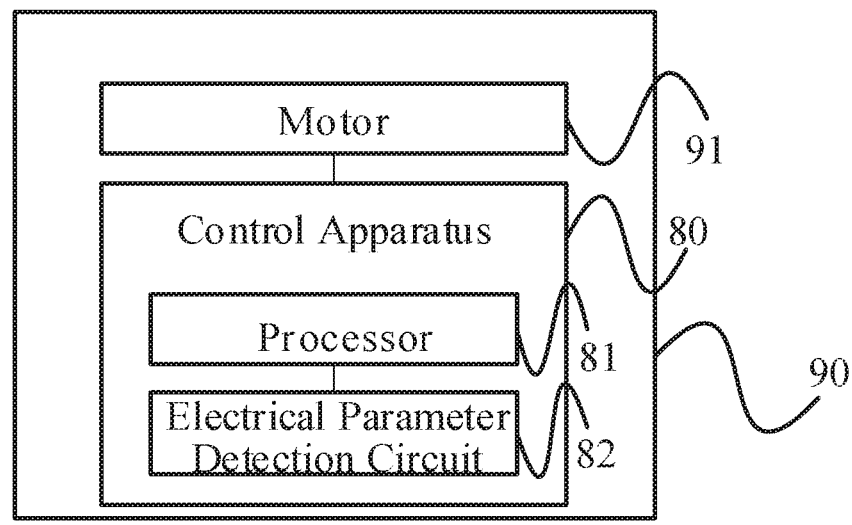
FIG. 9 is a block diagram of an exemplary power system consistent with various disclosed embodiments of the present disclosure.

The present disclosure provides a power system. FIG. 9 is a block diagram of an exemplary power system 90 consistent with various disclosed embodiments of the present disclosure. As shown in FIG. 9, the power system 90 includes a motor 91 and the control apparatus 80. The control apparatus 80 is electrically coupled to the motor 91 and configured to control the motor 91. The control apparatus 80, i.e., the motor control apparatus, includes the one or more processors 81. The one or more processors 81 are configured to obtain a present electrical parameter of a battery, calculate a compensation amount of the control signal of the motor according to the present electrical parameter, and modify a control signal of the motor according to the compensation amount of the control signal.

In some embodiments, the control apparatus 80 further includes the electrical parameter detection circuit 82. The electrical parameter detection circuit 82 is electrically coupled to the processor 81 for detecting the present electrical parameter of the battery.

The electrical parameter detection circuit 82 may include at least one of a coulometer, a voltage detection circuit, an electrical current detection circuit, or a resistance detection circuit.

In some embodiments, a compensation amount of the control signal of the motor may be calculated according to the present electrical parameter of the battery, and the control signal of the motor may be modified according to the compensation amount of the control signal, such that the control signal of the motor is prevented from fluctuating along with the change of the electrical parameter of the battery. Correspondingly, motor control signals under control of a same throttle signal may be prevented from being different. Thus, when a UAV performs actions that need high mobility, occurrence of issues of slow response and decreasing power of the UAV during a flight may be suppressed.

Figure 10:
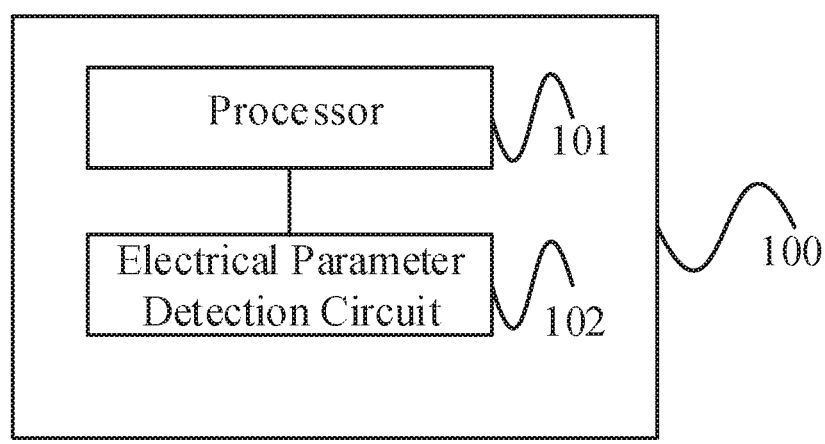
FIG. 10 is a block diagram of an exemplary motor control apparatus consistent with various disclosed embodiments of the present disclosure.

The present disclosure provides another motor control apparatus. FIG. 10 is a block diagram of an exemplary motor control apparatus 100 consistent with various disclosed embodiments of the present disclosure. As shown in FIG. 10, the control apparatus 100 includes one or more processors 101. The one or more processors 101 are configured to obtain a present electrical parameter of a battery, calculate a voltage compensation amount of the battery according to the present electrical parameter, and compensate an output voltage of the battery according to the voltage compensation amount, such that the output voltage of the battery is held stable.

The control apparatus of the present disclosure may be configured to execute one of the methods consistent with the disclosure, such as the method described above in connection with FIG. 6. Detailed descriptions of functions of the control apparatus are omitted here.

In some embodiments, a present electrical parameter of the battery may be detected, and a voltage compensation amount of the battery may be calculated according to the present electrical parameter. An output voltage of the battery may be compensated according to the voltage compensation amount, such that the output voltage of the battery is held stable. Accordingly, the control signal of the motor may be prevented from fluctuating with the change of the electrical parameter of the battery. Correspondingly, motor control signals under control of a same throttle signal may be prevented from being different. Thus, when a UAV performs actions that need high mobility, occurrence of issues of slow response and decreasing power of the UAV during a flight may be suppressed.

Further, the motor control apparatus 100 also includes an electrical parameter detection circuit 102. The electrical parameter detection circuit 102 is electrically coupled to the processor 101 for detecting the present electrical parameter of the battery.

The electrical parameter detection circuit 102 may include at least one of a coulometer, a voltage detection circuit, an electrical current detection circuit, or a resistance detection circuit.

Figure 11:
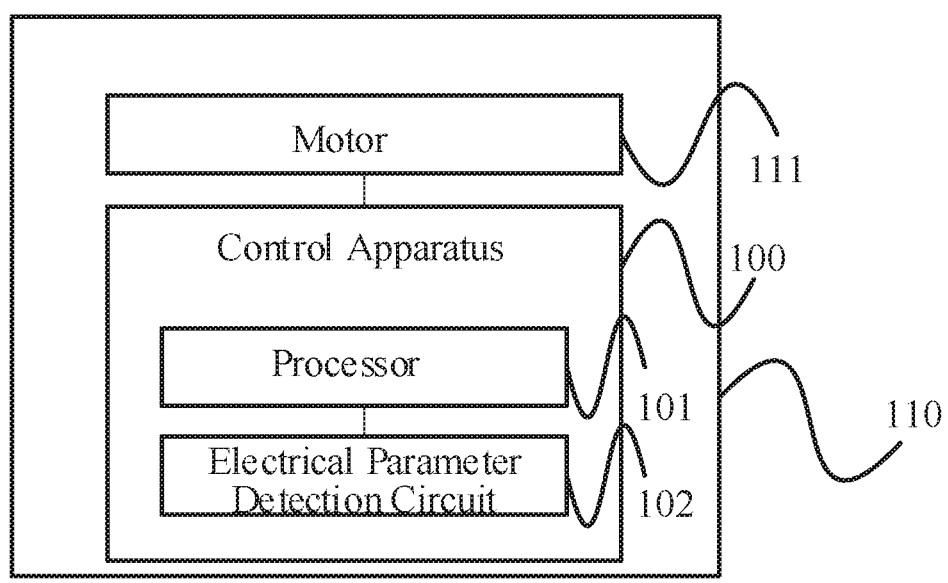
FIG. 11 is a block diagram of another exemplary power system consistent with various disclosed embodiments of the present disclosure.

The present disclosure provides another power system. FIG. 11 is a block diagram of another exemplary power system 110 consistent with various disclosed embodiments of the present disclosure. As shown in FIG. 11, the power system 110 includes a motor 111 and the control apparatus 100. The control apparatus 100 is electrically coupled to the motor 111 and configured to control the motor 111. The control apparatus 100 includes the one or more processors 101. The one or more processors 101 are configured to obtain a present electrical parameter of a battery, calculate a voltage compensation amount of the battery according to the present electrical parameter, and to compensate an output voltage of the battery according to the voltage compensation amount to maintain the output voltage of the battery stable.

Further, the control apparatus 100 also includes the electrical parameter detection circuit 102. The electrical parameter detection circuit 102 is electrically coupled to the processor 101 for detecting the present electrical parameter of the battery.

The electrical parameter detection circuit 102 may include at least one of a coulometer, a voltage detection circuit, an electrical current detection circuit, or a resistance detection circuit.

In some embodiments, a present electrical parameter of the battery may be detected, and a voltage compensation amount of the battery may be calculated according to the present electrical parameter. An output voltage of the battery may be compensated according to the voltage compensation amount, such that the output voltage of the battery is held stable. Accordingly, the control signal of the motor may be prevented from fluctuating with the change of the electrical parameter of the battery. Correspondingly, motor control signals under control of a same throttle signal may be prevented from being different. Thus, when a UAV performs actions that need high mobility, occurrence of issues of slow response and decreasing power of the UAV during a flight may be suppressed.

Figure 12:
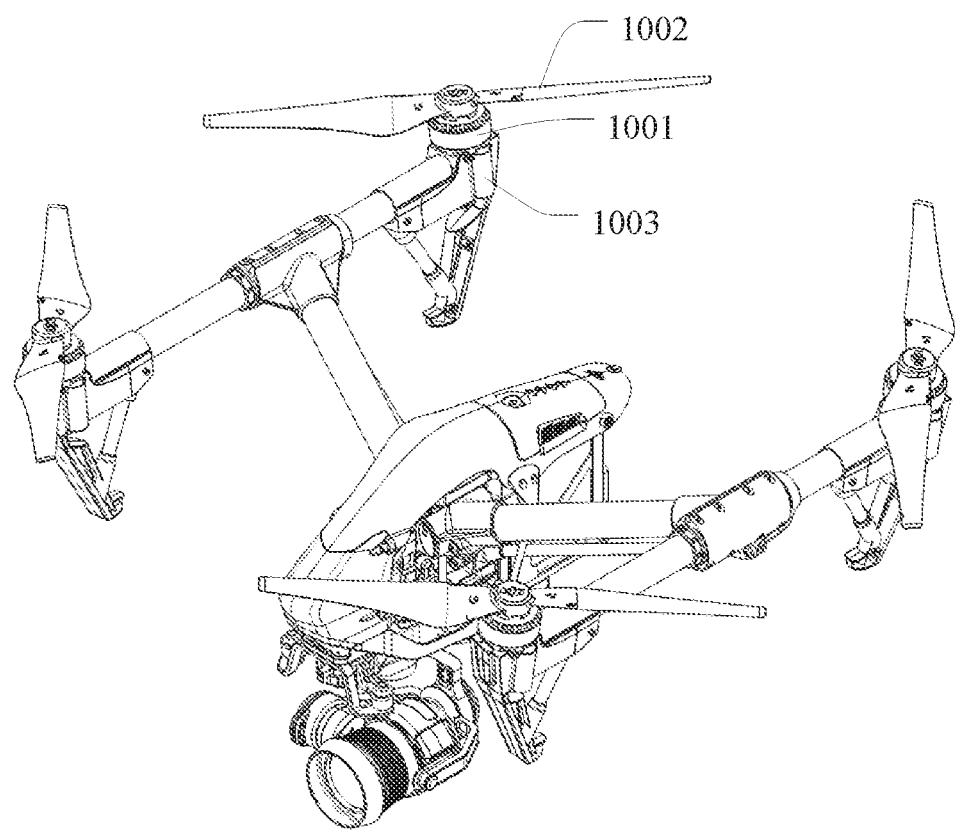
FIG. 12 is a schematic structural diagram of an exemplary unmanned aerial vehicle (UAV) consistent with various disclosed embodiments of the present disclosure.

The present disclosure provides an unmanned aerial vehicle (UAV). FIG. 12 is a schematic structural diagram of an exemplary UAV consistent with various disclosed embodiments of the present disclosure. As shown in FIG. 12, the UAV includes a fuselage, a power system 1001, a propeller 1002, a flight controller, and an electronic speed controller (ESC) 1003. In some embodiments, the power system 1001 includes the power system 90 shown in FIG. 9. The power system 90 may be mounted at the fuselage for providing flight power. As shown in FIG. 9, the power system 90 includes the motor 91 and the control apparatus 80. The control apparatus 80 is electrically coupled to the motor 91 and configured to control the motor 91. The control apparatus 80 includes the one or more processors 81. The one or more processors 81 are configured to obtain a present electrical parameter, calculate a compensation amount of the control signal of the motor according to the present electrical parameter, and modify a control signal of the motor according to the compensation amount of the control signal.

Further, the control apparatus 80 includes the electrical parameter detection circuit 82. The electrical parameter detection circuit 82 is electrically coupled to the processor 81 and configured to detect the present electrical parameter of the battery.

Further, the electrical parameter detection circuit 82 may include at least one of a coulometer, a voltage detection circuit, an electrical current detection circuit, or a resistance detection circuit.

In some embodiments, a compensation amount of the control signal of the motor may be calculated according to the present electrical parameter of the battery, and the control signal of the motor may be modified according to the compensation amount of the control signal, such that the control signal of the motor is prevented from fluctuating along with the change of the electrical parameter of the battery. Correspondingly, motor control signals under control of a same throttle signal may be prevented from being different. Thus, when a UAV performs actions that need high mobility, occurrence of issues of slow response and decreasing power of the UAV during a flight may be suppressed.

The present disclosure provides another UAV. As shown in FIG. 12, in some embodiments, the UAV includes the fuselage, the power system 1001, the propeller 1002, the flight controller, and the ESC 1003. In some embodiments, the power system 1001 includes the power system 110 shown in FIG. 11. The power system 110 is mounted at the fuselage and configured to provide flight power. The power system 110 includes the motor 111 and the control apparatus 100. The control apparatus 100 is electrically coupled to the motor 111 and configured to control the motor 111. The control apparatus 100 includes the one or more processors 101. The processors 101 are configured to obtain a present electrical parameter of the battery, calculate a voltage compensation amount of the battery according to the present electrical parameter, and compensate an output voltage of the battery according to the voltage compensation amount to maintain the output voltage of the battery stable.

Further, the control apparatus 100 includes the electrical parameter detection circuit 102. The electrical parameter detection circuit 102 is electrically coupled to the processor 101 and configured to detect the present electrical parameter of the battery.

Further, the electrical parameter detection circuit 102 may include at least one of a coulometer, a voltage detection circuit, an electrical current detection circuit, or a resistance detection circuit.

In these embodiments, a present electrical parameter of the battery may be detected, and a voltage compensation amount of the battery may be calculated according to the present electrical parameter. An output voltage of the battery may be compensated according to the voltage compensation amount, such that the output voltage of the battery is held stable. Accordingly, the control signal of the motor may be prevented from fluctuating with the change of the electrical parameter of the battery. Correspondingly, motor control signals under control of a same throttle signal may be prevented from being different. Thus, when a UAV performs actions that need high mobility, occurrence of issues of slow response and decreasing power of the UAV during a flight may be suppressed.

In some embodiments, a compensation amount of the control signal of the motor may be calculated according to a present electrical parameter of the battery, and a control signal of the motor may be modified according to the compensation amount of the control signal, such that the control signal of the motor is prevented from fluctuating along with the change of the electrical parameter of the battery. Correspondingly, motor control signals under control of a same throttle signal may be prevented from being different. Thus, when a UAV performs actions that need high mobility, occurrence of issues of slow response and decreasing power of the UAV during a flight may be suppressed. A compensation amount of the control signal of the motor may be calculated according to the present electrical parameter of the battery, and the control signal of the motor may be modified according to the compensation amount of the control signal, such that the control signal of the motor is prevented from fluctuating along with the change of the electrical parameter of the battery. Correspondingly, motor control signals under control of a same throttle signal may be prevented from being different. Thus, when a UAV performs actions that need high mobility, occurrence of issues of slow response and decreasing power of the UAV during a flight may be suppressed.

Those of ordinary skill in the art will appreciate that the exemplary elements and algorithm steps described above can be implemented in electronic hardware, or in a combination of computer software and electronic hardware. Whether these functions are implemented in hardware or software depends on the specific application and design constraints of the technical solution. One of ordinary skill in the art can use different methods to implement the described functions for different application scenarios, but such implementations should not be considered as beyond the scope of the present disclosure.

For the convenience and conciseness of the descriptions, only the above-described functional modules as divided are used as examples for illustrations. In actual applications, the above-described functions may be distributed to and implemented by different functional modules according to various application scenarios. That is, the internal structures of exemplary systems, devices, and units can be divided into different functional modules to complete all or some of the functions described above. For simplification purposes, detailed descriptions of the operations of exemplary systems, devices, and units may be omitted and references can be made to the descriptions of the exemplary methods.

The disclosed systems, apparatuses, and methods may be implemented in other manners not described here. For example, the devices described above are merely illustrative. For example, the division of units may only be a logical function division, and there may be other manners of dividing the units. For example, multiple units or components may be combined or may be integrated into another system, or some features may be ignored, or not executed. Further, the coupling or direct coupling or communication connection shown or discussed may include a direct connection or an indirect connection or communication connection through one or more interfaces, devices, or units, which may be electrical, mechanical, or in other form.

The units described as separate components may or may not be physically separate, and a component shown as a unit may or may not be a physical unit. That is, the units may be located in one place or may be distributed over a plurality of network elements. Some or all of the components may be selected according to the actual needs to achieve the object of the present disclosure.

In addition, the functional units in the various embodiments of the present disclosure may be integrated in one processing unit, or each unit may be an individual physically unit, or two or more units may be integrated in one unit. The above-described integrated units can be implemented in electronic hardware, or in a combination of computer software and electronic hardware.

A method consistent with the disclosure can be implemented in the form of computer program stored in a non-transitory computer-readable storage medium, which can be sold or used as a standalone product. The computer program can include instructions that enable a computing device, such as a processor, a personal computer, a server, or a network device, to perform part or all of a method consistent with the disclosure, such as one of the exemplary methods described above. The storage medium can be any medium that can store program codes, for example, a USB disk, a mobile hard disk, a read-only memory (ROM), a random access memory (RAM), a magnetic disk, or an optical disk.

Other embodiments of the disclosure will be apparent to those skilled in the art from consideration of the specification and practice of the embodiments disclosed herein. It is intended that the specification and examples be considered as exemplary only and not to limit the scope of the disclosure, with a true scope and spirit of the invention being indicated by the following claims.

What is claimed is:

1. A method for controlling a motor comprising:
   obtaining a present electrical parameter of a battery;
   calculating a compensation amount of a control signal of the motor according to the present electrical parameter; and
   modifying the control signal according to the compensation amount.

2. The method according to claim 1, wherein the present electrical parameter includes at least one of a present charge quantity of the battery, a present voltage of the battery, a present output electrical current of the battery, or a present internal resistance of the battery.

3. The method according to claim 2, wherein the control signal includes at least one of a control signal configured to control a rotation speed of the motor or a control signal configured to control an output power of the motor.

4. The method according to claim 3, wherein:
   the present electrical parameter of the battery includes the present voltage of the battery; and
   calculating the compensation amount includes:
      calculating the compensation amount of the control signal of the motor corresponding to a subsequent time point according to the present voltage of the battery and a preset voltage model including one-to-one correspondences between voltages of the battery and preset compensation amounts.

5. The method according to claim 4, wherein modifying the control signal includes:
   modifying, at a present time point, the control signal according to the compensation amount.

6. The method according to claim 3, wherein:
   the present electrical parameter of the battery includes the present voltage of the battery; and
   calculating the compensation amount of the control signal of the motor includes:
      calculating in real time the compensation amount of the control signal of the motor according to the present voltage of the battery.

7. The method according to claim 6, wherein:
   calculating in real time the compensation amount of the control signal includes:
      calculating in real time a compensation amount of a voltage outputted to the motor according to the present voltage of the battery; and
   modifying the control signal includes:
      modifying an original voltage outputted to the motor according to the compensation amount of the voltage.

8. The method according to claim 7, wherein the compensation amount of the voltage is determined according to a difference between a full voltage of the battery and the present voltage of the battery.

9. A method for controlling a motor comprising:
   obtaining a present electrical parameter of a battery;
   calculating a voltage compensation amount of the battery according to the present electrical parameter; and
   compensating an output voltage of the battery according to the voltage compensation amount to maintain the output voltage of the battery stable.

10. The method according to claim 9, wherein the present electrical parameter of the battery includes at least one of a present charge quantity of the battery, a present voltage of the battery, a present output electrical current of the battery, or a present internal resistance of the battery.

11. The method according to claim 10, wherein:
the present electrical parameter of the battery includes the present voltage of the battery; and
calculating the voltage compensation amount of the battery includes:
   calculating the voltage compensation amount of the battery according to the present voltage of the battery and a full voltage of the battery, the voltage compensation amount being equal to a difference between the full voltage and the present voltage.

12. An apparatus for controlling a motor comprising:
one or more processors configured to:
   obtain a present electrical parameter of a battery;
   calculate a compensation amount of a control signal of the motor according to the present electrical parameter; and
   modify the control signal according to the compensation amount.

13. The apparatus according to claim 12, further comprising:
an electrical parameter detection circuit electrically coupled to the one or more processors and configured to detect the present electrical parameter.

14. The apparatus according to claim 13, wherein the electrical parameter detection circuit includes at least one of a coulometer, a voltage detection circuit, an electrical current detection circuit, or a resistance detection circuit.

15. The apparatus according to claim 14, wherein the one or more processors are further configured to:
   calculate the compensation amount of the control signal of the motor corresponding to a subsequent time point according to the present voltage of the battery and a preset voltage model including one-to-one correspondences between voltages of the battery and preset compensation amounts; and
   modify, at a present time point, the control signal according to the compensation amount.

16. The apparatus according to claim 14, wherein the one or more processors are further configured to:
   calculate in real time the compensation amount of the control signal of the motor according to the present voltage of the battery.

17. The apparatus according to claim 16, wherein the one or more processors are further configured to:
   calculate in real time a compensation amount of a voltage outputted to the motor according to the present voltage of the battery; and
   modify an original voltage outputted to the motor according to the compensation amount of the voltage outputted to the motor.

* * * * *